(12) United States Patent
Kato

(10) Patent No.: US 6,825,635 B2
(45) Date of Patent: Nov. 30, 2004

(54) VIBRATION ISOLATOR, DEVICE MANUFACTURING APPARATUS AND METHOD, SEMICONDUCTOR MANUFACTURING PLANT AND METHOD OF MAINTAINING DEVICE MANUFACTURING APPARATUS

(75) Inventor: Hiroaki Kato, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 268 days.

(21) Appl. No.: 10/102,726

(22) Filed: Mar. 22, 2002

(65) Prior Publication Data

US 2002/0139988 A1 Oct. 3, 2002

(30) Foreign Application Priority Data

Mar. 27, 2001 (JP) ........................ 2001-091017

(51) Int. Cl.$^7$ ............................................ H01L 21/30
(52) U.S. Cl. ........................ 318/649; 318/489; 248/638
(58) Field of Search ................ 318/460, 489, 318/638, 648, 649; 248/550, 638

(56) References Cited

U.S. PATENT DOCUMENTS 4,976,415 A * 12/1990 Murai et al. ................ 267/136
5,279,162 A * 1/1994 Takebe et al. ................ 73/726
5,511,005 A * 4/1996 Abbe et al. ................... 702/84
5,812,396 A    9/1998 Kato ..................... 364/167.07
6,155,542 A   12/2000 Kato et al. .................. 267/136
6,170,622 B1   1/2001 Wakui et al. ............... 188/378
6,359,688 B2 * 3/2002 Akimoto et al. ............ 356/401
6,392,741 B1 * 5/2002 Mori et al. .................... 355/53

FOREIGN PATENT DOCUMENTS

JP           6-28698      4/1994
JP          10-156144    6/1998

* cited by examiner

Primary Examiner—Bentsu Ro
(74) Attorney, Agent, or Firm—Fitzpatrick, Cella, Harper & Scinto

(57) ABSTRACT

A vibration isolator includes a vibration isolation platform, a vibration sensor installed on the vibration isolation platform, and an angle sensor for sensing an inclination angle of the vibration isolation platform. A detection signal from the vibration sensor is corrected based upon an output from the angle sensor, and the corrected detection signal is used in order to suppress vibration of the vibration isolation platform.

16 Claims, 12 Drawing Sheets

DETECTION OF HORIZONTAL
TRANSLATIONAL ACCELERATION

DETECTION OF INCLINATION

VELOCITY SENSOR SIGNAL

INCLINATION SIGNAL

INCLINATION CORRECTION SIGNAL

INCLINATION-CORRECTED VIBRATION SENSOR SIGNAL

HORIZONTAL AXIS:Time[s]

FIG. 10

```
URL  http://www.maintain.co.jp/db/input.html

MALFUNCTION DATABASE INPUT SCREEN

DATE OF OCCURRENCE  [2000/3/15]  ~404
MODEL  [* * * * * * * * *]  ~401
SUBJECT MATTER  [OPERATING MALFUNCTION (ERROR AT BOOTING)]  ~403
EQUIPMENT SERIAL NO.  [465NS4580001]  ~402
DEGREE OF URGENCY  [D]  ~405
CONDITION   [LED CONTINUES FLASHING
             AFTER POWER IS TURNED ON]   ~406

COUNTERMEASURE  [POWER TURNED ON AGAIN
METHOD          (RED BUTTON PUSHED AT START UP)]  ~407

PROGRESS  [TEMPORARY MEASURES COMPLETED]
REPORT                                            ~408

[SEND] [RESET]        410                411              412
              LINK TO DATABASE OF RESULTS  SOFTWARE LIBRARY  OPERATION GUIDE
```

FLOW OF SEMICONDUCTOR DEVICE MANUFACTURE

VIBRATION ISOLATOR, DEVICE MANUFACTURING APPARATUS AND METHOD, SEMICONDUCTOR MANUFACTURING PLANT AND METHOD OF MAINTAINING DEVICE MANUFACTURING APPARATUS

FIELD OF THE INVENTION

This invention relates to a vibration isolator used in a semiconductor manufacturing apparatus and/or an electron microscope, etc. More particularly, the invention relates to a vibration isolator, referred to as an active vibration isolator, for driving an actuator in accordance with a detection signal from a vibration sensor. The invention further relates to a device manufacturing apparatus such as an exposure apparatus having the above-mentioned vibration isolator, a device manufacturing method, a semiconductor manufacturing plant and a method of maintaining the device manufacturing apparatus.

BACKGROUND OF THE INVENTION

In precision instruments such as electron microscopes and semiconductor device manufacturing apparatus, the transfer of vibration from the external environment to the apparatus proper must be minimized.

It is essential, therefore, that the precision equipment be mounted on a precision vibration isolator. In particular, since an XY stage for exposure in an exposure apparatus moves continuously and at high speed, it is required that the vibration isolator achieve, in good balance, a vibration isolating capability with regard to external vibration and a vibration damping capability with regard to internal vibration produced by operation of the mounted equipment itself.

An active-type vibration isolator has been put into practical use in recent years to meet these requirements. Such a vibration isolator makes it possible to control vibration effectively by driving an actuator in accordance with a detection signal from a vibration sensor. The active vibration isolator makes it possible to achieve balanced vibration isolating and vibration damping capabilities. This is difficult to realize with a passive vibration isolator that relies solely upon a support mechanism having spring and damper characteristics.

A typical embodiment of a vibration isolator seen in the prior art is disclosed in the specification of Japanese Patent Application Laid-Open No. 10-156144, entitled "Vibration Isolator". In accordance with this disclosure, acceleration sensors are adopted as vibration sensors for sensing the vibration of a vibration isolation platform, and air springs are adopted as actuators for driving the vibration isolation platform. The acceleration sensors are arranged with their axes of detection pointing in the horizontal and vertical directions and detect acceleration of the vibration isolation platform in the horizontal and vertical directions.

The air springs, which support the vibration isolation platform in such a manner that their thrust producing axes agree with the horizontal and vertical directions, apply horizontal and vertical thrust to the vibration isolation platform. Vibration of the vibration isolation platform is suppressed in excellent fashion by applying so-called vibration feedback in accordance with which the air springs drive the vibration isolation platform along the horizontal and vertical directions in accordance with compensation values obtained by applying appropriate compensation to the detection signals from the acceleration sensors.

In a precision vibration isolator of this kind, it is common knowledge to use servo-type acceleration sensors, which exhibit excellent resolution with respect to minute vibration, for the purpose of sensing vibration of the vibration isolation platform. The principle of acceleration detection by a servo-type acceleration sensor will be described with reference FIG. 6A.

FIG. 6A illustrates an arrangement where a servo-type acceleration sensor is disposed in the horizontal direction. A case is fixed to a mounting surface and a pendulum is suspended from the case. Acceleration produced at the mounting surface is equal to an inertial force that acts upon the pendulum. In this servo-type acceleration sensor, a servo mechanism is provided in such a manner that the displacement of the pendulum is maintained at zero. The velocity of the mounting surface is sensed using a servo electromagnetic force.

The servo-type acceleration sensor also senses inclination of the mounting surface using the earth's gravitational force, as shown in FIG. 6B. Thus, while the servo-type acceleration sensor is advantageous in that it can sense even DC components of acceleration, it is disadvantageous in terms of controlling vibration precisely.

More specifically, in a case where the servo-type acceleration sensor is disposed on a horizontal plane in order to sense acceleration in the horizontal direction and the horizontal direction is the direction of interest, a problem which arises is that inclination of the mounting surface, which is regarded as another component, also is sensed. The fact that another component is included in the detection signal is equivalent to application of measurement noise to the vibration-control feedback loop. This is a factor that impedes an improvement in the performance of the vibration isolator. If horizontal vibration feedback in the horizontal direction is applied in an active vibration isolator, vibration feedback cannot be applied properly because the detection signal includes another component that represents inclination. As a consequence, the vibration isolation platform is caused to vibrate instead of having its vibration suppressed.

A servo-type velocity sensor of the kind disclosed in the specification of Japanese Utility Model Publication No. 6-28698 (entitled "Servo-type Vibration Receiver") also has been put into practical use in recent years. Since velocity is obtained by an integration of acceleration, a velocity sensor is advantageous in that it has a low-frequency sensitivity that is higher than that of an acceleration sensor. Velocity sensors are utilized in architectural structures and in the measurement of ground vibration where observation of low-frequency components is important.

However, the principle of velocity detection by a servo-type velocity sensor is similar to the principle of acceleration detection by a servo-type acceleration sensor that uses a pendulum of the kind shown in FIGS. 6A and 6B. When velocity in the horizontal direction is sensed by a servo-type vibration sensor, the aforementioned problem still arises, namely, the fact that other components ascribable to inclination also are sensed.

Exactly the same problem arises also when a servo-type acceleration sensor or servo-type velocity sensor is disposed in the vertical direction. The sensor will sense not only vertical translational vibration but also inclination of the sensor mounting surface with respect to the vertical axis. As a consequence, when vibration feedback in the vertical direction is applied in an active-type vibration isolator, vibration feedback cannot be applied properly because the sensor signal includes inclination-related components. As a consequence, the vibration isolation platform is caused to vibrate instead of having its isolation suppressed.

In other words, because a sensor-type vibration isolator whose use in a precision vibration isolator is common knowledge is influenced by inclination of the vibration isolation platform, the performance of the vibration isolator is degraded when vibration feedback is applied.

SUMMARY OF THE INVENTION

Accordingly, an object of the present invention is to provide a vibration isolator for sensing vibration only in a horizontal translational direction or vertical translational direction without being affected by inclination of a vibration isolation platform, thereby making it possible to control vibration in an ideal fashion, as well as a device manufacturing apparatus and method, a semiconductor manufacturing plant and a method of maintaining the device manufacturing apparatus that employ the vibration isolator.

According to the present invention, the foregoing object is attained by providing a vibration isolator comprising: a vibration isolation platform, a vibration sensor installed on the vibration isolation platform, and an angle sensor for sensing an inclination angle of the vibration isolation platform, wherein a detection signal from the vibration sensor is corrected based upon an output from the angle sensor, and the corrected detection signal is used in order to suppress vibration of the vibration isolation platform.

The detection signal from the vibration sensor contains an inclination component owing to the influence of inclination of the vibration isolation platform. The inclination component contained in the output of the vibration sensor, however, is cancelled out using the angle sensor. As a result, it is possible to sense the vibration component more precisely than heretofore and, hence, vibration control of the vibration isolator can be performed in an ideal fashion.

The angle sensor should be one that can sense the inclination component sensed by the vibration sensor. Though a gyroscope can be mentioned as one example, use of a displacement sensor is particularly preferred. Preferably, two or more of such displacement sensors are installed in order to sense vertical displacement of the vibration isolation platform at two or more locations. Each displacement sensor senses vertical displacement of the vibration isolation platform at its particular position, and the angle of inclination of the vibration isolation platform can be calculated from the difference between the detection signals produced by the displacement sensors.

Inclination of the vibration sensor is compensated for by causing an appropriate inclination compensator to act upon the angle of inclination and then subtracting the compensated value from the detection signal of the vibration sensor. This makes it possible to sense translational vibration of the vibration isolation platform accurately without the influence of platform inclination. The inclination compensator converts the inclination signal, which is output from the angle sensor, to an inclination correction signal that is equivalent to the inclination component of the vibration isolation platform sensed by the vibration sensor, thereby making it possible to cancel out the inclination component of the vibration isolation platform, which is sensed by the vibration sensor, by the inclination correction signal.

An applicable vibration sensor in the present invention is one that can sense vibration of the vibration isolation platform. In particular, it is preferred that the vibration sensor be of the type in which the detection signal includes a vibration component and an inclination component. More specifically, the sensor may be a velocity sensor or an acceleration sensor. Generally, in a precision vibration isolator, a servo-type velocity sensor is used as the velocity sensor and a servo-type acceleration sensor is used as the acceleration sensor.

As for the overall structure of the vibration isolator according to the present invention, the vibration isolation platform is supported along two axes, namely, the vertical and horizontal axes, by three or more actuators, and the detection signal from the vibration sensor is fed back to drive the actuators, thereby suppressing translational vibration of the vibration isolation platform along two axes, namely, the vertical and horizontal directions, and rotational vibration of the vibration isolation platform about two axes, namely, the vertical and horizontal directions. The correction of the detection signal from the vibration sensor needs to be carried out only when vibration of the vibration isolation platform in the horizontal or vertical translational direction is fed back.

An apparatus for manufacturing a semiconductor device according to the present invention is provided for executing various processes when a semiconductor device is manufactured through these processes. The apparatus comprises the vibration isolator of the present invention and a main body of the apparatus, and the main body of the apparatus is installed on a vibration isolation platform. Examples of the manufacturing apparatus that can be mentioned are an exposure apparatus, a resist treatment apparatus, an etching apparatus, a heat treatment apparatus, a thin-film forming apparatus, a smoothing apparatus, an assembly apparatus and an inspection apparatus.

The manufacturing apparatus further includes a display, a network interface and a computer for executing network software, and it is possible for maintenance information for the manufacturing apparatus to be communicated by data communication. The network software preferably provides the display with a user interface for accessing a maintenance database, which is connected to an external network of a plant at which the manufacturing apparatus has been installed, and which is supplied by a vendor or user of the manufacturing apparatus, thereby making it possible to obtain information from the database via the external network.

A method of manufacturing a semiconductor device according to the present invention comprises the steps of placing a group of manufacturing apparatus for performing various processes, inclusive of the manufacturing apparatus of the present invention, in a plant for manufacturing semiconductor devices, and manufacturing a semiconductor device by performing a plurality of processes using this group of manufacturing apparatus. The method may further include steps of interconnecting the group of manufacturing apparatus by a local-area network, and communicating, by data communication, information relating to at least one manufacturing apparatus in the group of manufacturing apparatus between the local-area network and an external network outside the plant.

Further, maintenance information for the manufacturing apparatus may be obtained by accessing, by data communication via the external network, a database supplied by a vendor or user of the manufacturing apparatus, or production management may be performed by data communication with a semiconductor manufacturing plant other than the first-mentioned semiconductor manufacturing plant via the external network.

A semiconductor manufacturing plant according to the present invention comprises: a group of manufacturing apparatus for performing various processes, inclusive of the manufacturing apparatus of the present invention, a local-area network for interconnecting the group of manufacturing apparatus, and a gateway for making it possible to access, from the local-area network, an external network outside the plant, whereby information relating to at least one of the manufacturing apparatus can be communicated by data communication.

A method of maintaining the device manufacturing apparatus according to the present invention installed in a semiconductor manufacturing plant comprises the steps of: providing a maintenance database, which is connected to an external network of the semiconductor manufacturing plant, by a vendor or user of the manufacturing apparatus, allowing access to the maintenance database from within the semiconductor manufacturing plant via the external network, and transmitting maintenance information, which is stored in the maintenance database, to the side of the semiconductor manufacturing plant via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 10 shows a specific example of a user interface;

DESCRIPTION OF THE PREFERRED EMBODIMENT

First Embodiment

A preferred embodiment of a vibration isolator according to the present invention will now be described in detail with reference to the drawings.

Figure 1:
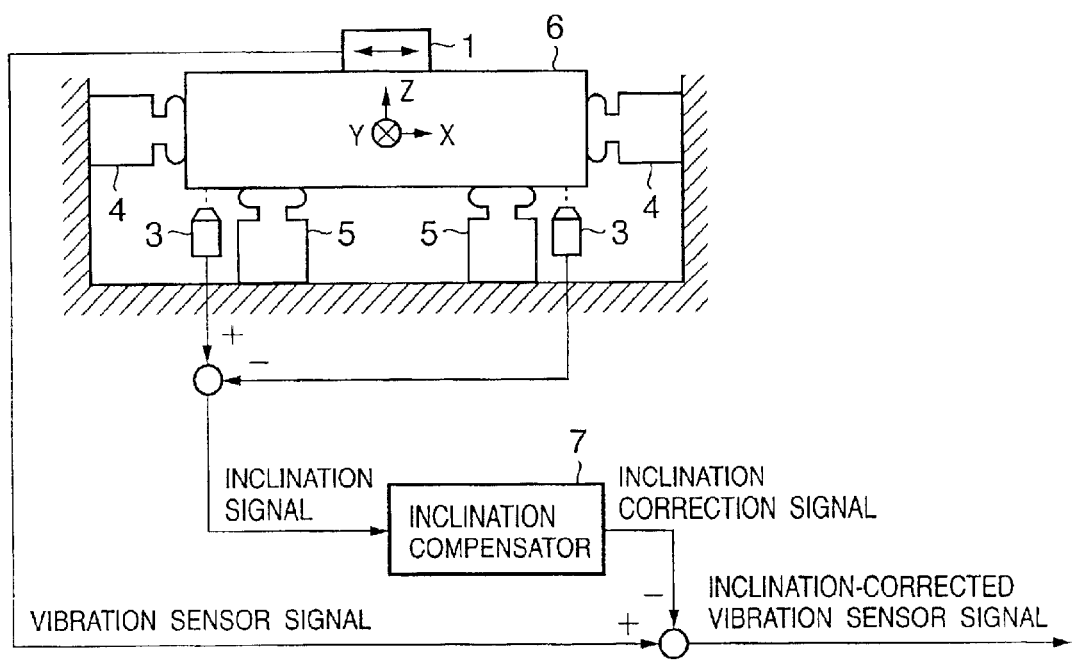
FIG. 1 is a diagram illustrating an example of a vibration isolator according to the present invention.

FIG. 1 is a diagram illustrating the structure of a vibration isolator according to a preferred embodiment of the present invention.

As shown in FIG. 1, a vibration isolation platform 6 is supported on a floor in a floating state by horizontal air springs 4 and vertical air springs 5. Each horizontal air spring 4, which has a horizontal stroke implemented by an air-spring bellows, supports the vibration isolation platform 6 in the horizontal direction. Similarly, each vertical air spring 5, which has a vertical stroke implemented by an air-spring bellows, supports the vibration isolation platform 6 in the vertical direction.

The horizontal air springs 4 and vertical air springs 5 act as support legs that support the vibration isolation platform 6 and serve also as actuators that produce a damping force by producing internal pressure. In the active-type vibration isolator of this example, the horizontal air springs 4 and vertical air springs 5 damp vibration of the vibration isolation platform 6 by applying a damping force to the vibration isolation platform 6.

Figure 2:
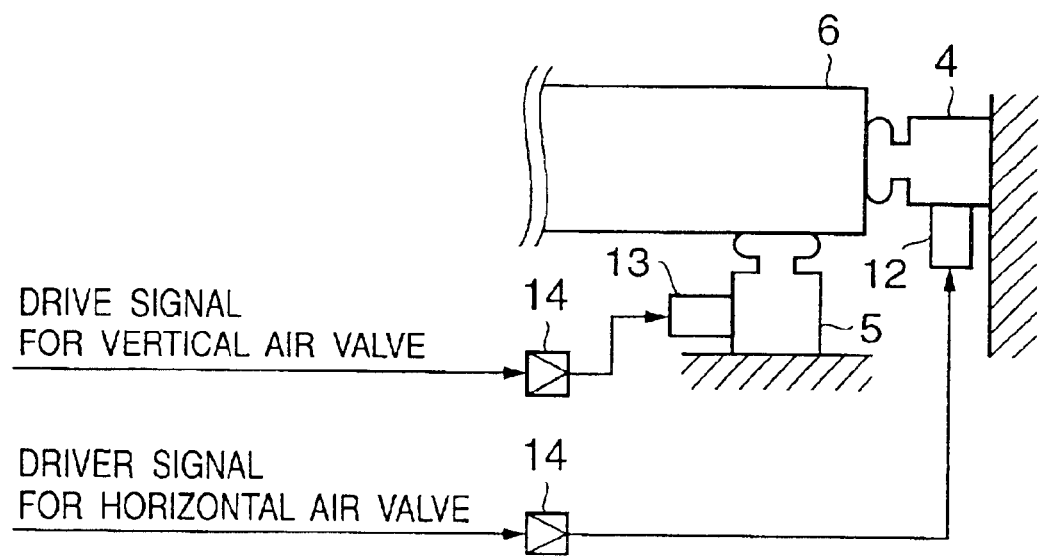
FIG. 2 is a diagram illustrating a mechanism for controlling internal pressure of air springs shown in FIG. 1.

The mechanism that controls the internal pressure of the horizontal air springs 4 and vertical air springs 5 will now be described. As the control mechanism is the same for both the horizontal and vertical directions, the mechanism will be described solely with regard to the horizontal air springs 4. As shown in FIG. 2, internal pressure of the horizontal air spring 4 is controlled by a horizontal air valve 12 of pressure controlling type. The horizontal air valve 12 is such that output pressure thereof varies in accordance with the amount of valve drive (stroke). A compensator acts appropriately upon the output signal of a vibration sensor to generate the drive signal of the horizontal air valve, and the horizontal air valve 12 is driven via a power amplifier in accordance with the drive signal, thereby applying the damping force to the vibration isolation platform 6.

Figure 3:
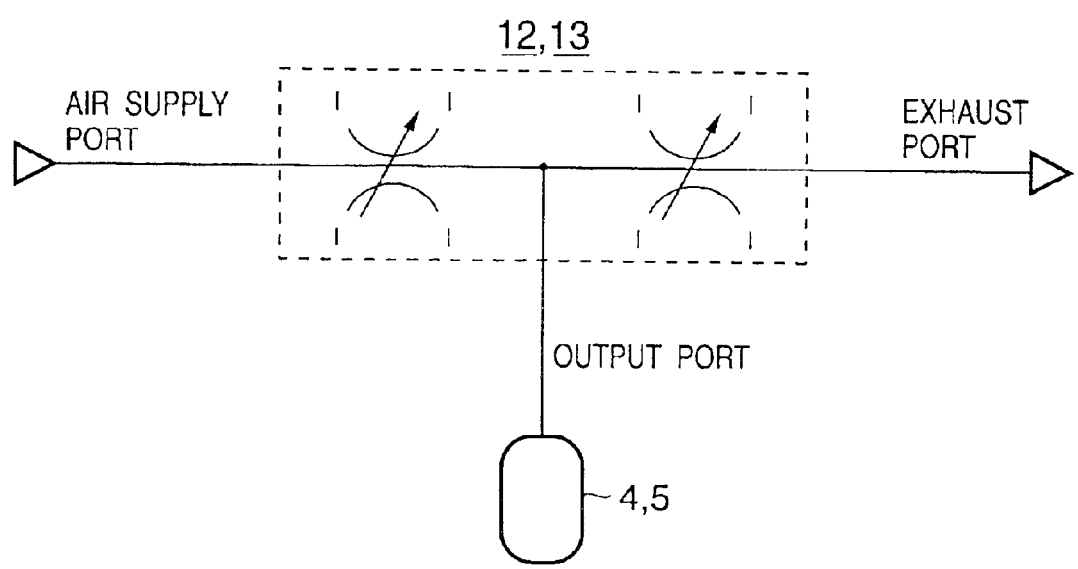
FIG. 3 is a diagram illustrating the structure of an air valve.

The operating principle of the horizontal air valve 12 will be described in further detail with reference to FIG. 3.

The horizontal air valve 12 is a three-port valve having an air supply port, an exhaust port and an output port. Air under high pressure is supplied from the air supply port. The exhaust port usually is open to the atmosphere. The output port is connected to the horizontal air spring 4. The output pressure of the horizontal air valve 12 agrees with the internal pressure of the horizontal air spring 4. A throttle mechanism is provided between the air supply port and the output port and between the output port and the exhaust port. The output pressure is decided by the ratio of the flow-path resistances of these throttle mechanisms.

The throttle mechanism is such that its flow-path resistance can be varied and the principal part of the mechanism is of the nozzle-flapper or pivot type. In the case of the nozzle-flapper-type mechanism, the flapper is driven so that the flow-path resistance of each throttle mechanism can be varied. The amount of valve drive in the horizontal air valve 12 is the amount by which the flapper is driven. High-pressure air, which is the working fluid, is exhausted steadily from the air supply port to the exhaust port. Thus, the internal pressure of the horizontal air spring 4 is controlled in dependence upon the amount of drive of horizontal air valve 12.

This embodiment will be described with reference again to FIG. 1.

An XYZ coordinate system is set upon in such a manner that the XY plane will agree with the horizontal plane and such that the Z axis will point in the vertical direction. Motion of the vibration isolation platform 6 usually has six degrees of freedom. However, in order to describe the essence of the present invention in simple terms, an embodiment to which the invention is applied is disclosed with respect to one degree of freedom that is translational motion in the horizontal direction. Specifically, with regard to detection of vibration of the vibration isolation platform 6, horizontal translational motion along the X axis will be considered in FIG. 1. A vibration sensor 1 is mounted on the vibration isolation platform 6 in such a manner that its detection axis coincides with the direction of the X axis. The vibration sensor 1 senses vibration of the vibration isolation platform 6 along the X axis, namely, along the direction of horizontal translation.

Generally, in a precision vibration isolator, a servo-type acceleration sensor, servo-type velocity sensor or geophone sensor, etc., is used as the vibration sensor 1. These sensors shall be referred to generically as the vibration sensor 1. Displacement sensors 3 are placed on the vibration isolation platform 6 in such a manner that their detection axes point along the direction of the Z axis. These sensors sense displacement of the vibration isolation platform 6 along the Z axis, namely along the vertical direction. Since two of the displacement sensors 3 are installed, namely one at the left end and one at the right end of the vibration isolation platform 6, the angle of rotation of the vibration isolation platform 6 about the Y axis will be found if the difference between the outputs of these two sensors is calculated. This angle corresponds to inclination of the vibration isolation platform 6 about the Y axis. These two displacement sensors 3 construct an angle sensor and the difference signal between the outputs of these two sensors represents an inclination signal.

Though not illustrated in FIG. 1, a precision stage is mounted on the vibration isolation platform 6 in a semiconductor manufacturing apparatus. Since movement of the stage is accompanied by movement of the position of the center of gravity of the structure, which includes the vibration isolation platform 6 and precision positioning stage, the vibration isolation platform 6 develops a transient inclination.

Further, the vibration isolation platform 6 is not supported rigidly on the floor. As a consequence, the vibration isolation platform 6 develops vibration accompanied by inclination at a minute level. Though the vibration sensor 1 is installed for the purpose of sensing vibration of the vibration isolation platform 6 in the horizontal direction, the vibration isolation platform 6 tilts and, as a result of such tilt, the output signal of the vibration sensor contains a horizontal translational component and an inclination component.

In a case where feedback in the horizontal direction is applied, the fact is that another component such as the inclination component is contained in the output signal of the vibration sensor and is equivalent to inclusion of measurement noise in the feedback signal. As a consequence, the vibration isolation platform 6 is caused to shake owing to the influence of the inclination component instead of having its vibration suppressed. In this embodiment, the inclination component contained in the output signal of the vibration sensor is cancelled out by the inclination signal obtained from the displacement sensors 3, as a result of which, vibration in the horizontal direction is sensed accurately. This inclination correction applied to the vibration sensor is a characterizing feature of the present invention.

The inclination component sensed by the vibration sensor 1 when the vibration isolation platform 6 tilts can be expressed as the result of causing a certain transfer function to act upon the inclination signal representing the inclination of the vibration isolation platform 6. An inclination compensator 7 has an input/output characteristic that is equivalent to this transfer function. The inclination compensator 7 outputs an inclination correction signal which is the result of the inclination compensator 7 acting upon the inclination signal. The inclination correction signal is equal to the inclination component contained in the output signal of the vibration sensor 1.

Accordingly, if the inclination correction signal output from the inclination compensator 7 is subtracted from the output signal of the vibration sensor 1, a vibration sensor signal corrected for inclination is obtained. The vibration sensor signal corrected for inclination does not contain an inclination component, but is the result of accurately sensing vibration in the direction of horizontal translation. If the horizontal air spring 4 is driven based upon the vibration sensor signal corrected for inclination, therefore, vibration feedback can be applied with only a vibration component along the direction of the X axis; no inclination component will be included. This means that vibration of the vibration isolation platform 6 can be suppressed in the vibration isolator of this embodiment, so that the influence of an inclination component upon the performance of the vibration isolator, which is a problem in the prior art, vanishes.

The effects of this embodiment disclosed in FIG. 1 are indicated by experimental data in FIGS. 7A to 7D. FIGS. 7A to 7D illustrate various signals in a case where such an inclination correction is applied.

Figure 7A:
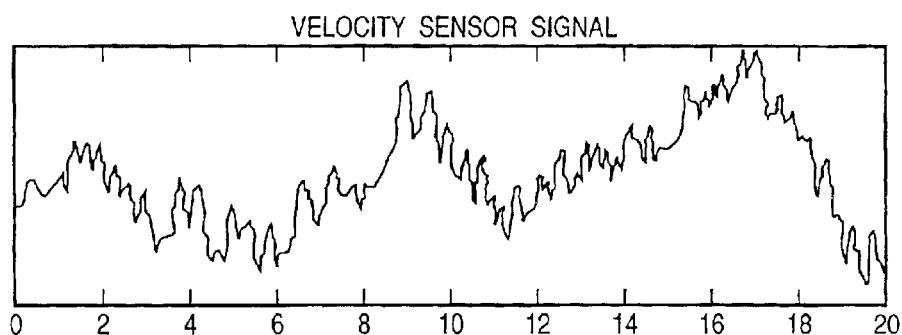
FIGS. 7A to 7D are graphs illustrating experimental results relating to the vibration isolator of the present invention.
Figure 7B:
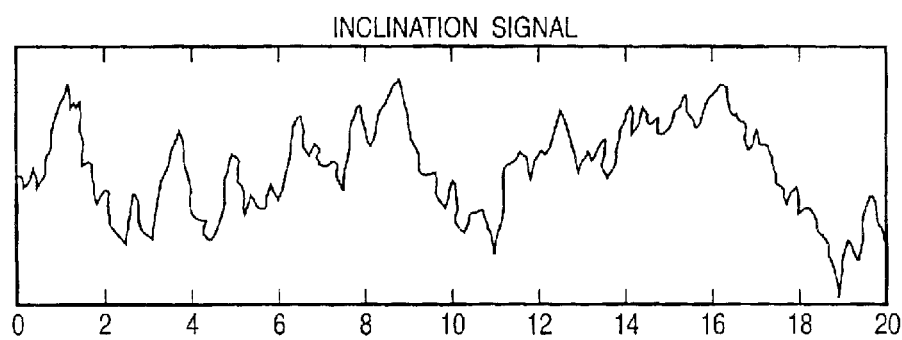
Figure 7C:
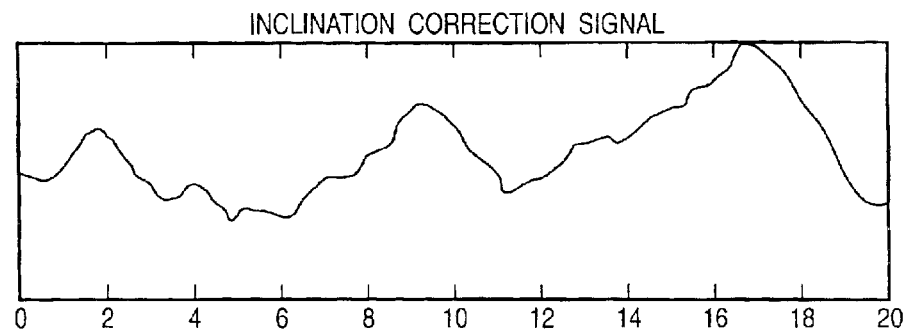
Figure 7D:
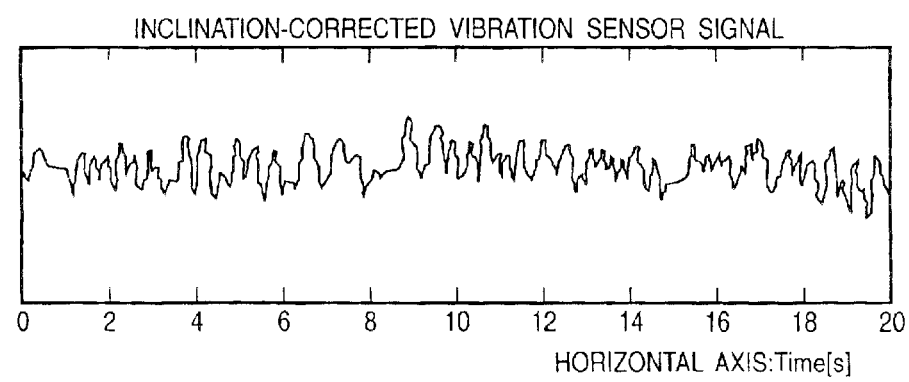

In FIGS. 7A to 7D, the output values of the signals are plotted along the vertical axis and time (in seconds) is plotted along the horizontal axis. The vibration isolation platform 6 is vibrated along two axes, namely along the direction of horizontal translation and in a rotational direction (direction of inclination). The vibration is applied along the two axes at the same time and in uncorrelated fashion so that the output signal of the vibration sensor will include both a horizontal translational component and an inclination component. The vibration sensor signal shown in FIG. 7A and the inclination signal shown in FIG. 7B clearly exhibit correlation. The inclination correction signal shown in FIG. 7C is produced by subjecting the inclination signal of FIG. 7B to appropriate compensation by the inclination compensator 7. This signal is the inclination component contained in the vibration sensor signal of FIG. 7A. The vibration sensor signal of FIG. 7D that has undergone the inclination correction exhibits absolutely no low frequency oscillation. As a result, the vibration of the vibration isolation platform 6 in the direction of horizontal translation is sensed in accurate fashion.

Second Embodiment

Described next will be an embodiment for a case where the present invention is applied to a vibration isolator having six degrees of freedom of motion. In the vibration isolator of this embodiment, the vibration isolation platform is supported by a plurality of air springs. The vibration isolation platform therefore undergoes rigid motion with three degrees of freedom in each of the translational and rotational directions. With regard to the three degrees of freedom in the translational direction, it is required that the output signal of the vibration sensor be corrected for inclination.

First, the mechanical structure of a vibration isolator having six degrees of freedom of motion will be described with reference to FIG. 4. Here also the XYZ coordinate system is set up in such a manner that the XY plane will agree with the horizontal plane and such that the Z axis will point in the vertical direction. The front side of the vibration isolation platform 6 as viewed in FIG. 4 coincides with the direction of the X axis. The vibration isolation platform 6 has a triangular shape and its three corners are supported by horizontal air springs 4a, 4b, 4c and vertical air springs 5a, 5b, 5c. Horizontal vibration sensors 1a, 1b, 1c, vertical vibration sensors 2a, 2b, 2c and vertical displacement sensors 3a, 3b, 3c are provided in close proximity to respective ones of the horizontal air springs 4a, 4b, 4c and vertical air springs 5a, 5b, 5c.

The vibration isolation platform 6 is supported on the floor along the two horizontal axes by the horizontal air springs 4a, 4b, 4c provided in the legs of the vibration isolation platform 6. The strokes of these air springs lie along the horizontal direction. The horizontal air springs 4a and 4b support the vibration isolation platform 6 along the Y direction and the horizontal air spring 4c supports the vibration isolation platform 6 along the X direction, which is perpendicular to the Y direction. The vertical air springs 5a, 5b, 5c of the three legs have their strokes along the vertical direction and support the vibration isolation platform 6 on the floor along the vertical direction. The horizontal air springs 4a, 4b, 4c and the vertical air springs 5a, 5b, 5c serve as the support legs for supporting the vibration isolation platform 6 and, at the same time, function as actuators that apply a damping force to the vibration isolation platform 6 by controlling internal pressure.

The horizontal vibration sensors 1a, 1b and 1c are installed on the vibration isolation platform 6 in such a manner that their axes of detection will coincide with the horizontal direction. The direction along which vibration is sensed by the horizontal vibration sensors 1a and 1b agrees with the direction of the Y axis, and the direction along which vibration is sensed by the horizontal vibration sensor 1c agrees with the direction of the X axis. The vertical vibration sensors 2a, 2b and 2c are installed on the vibration isolation platform 6 in such a manner that their axes of detection will coincide with the vertical direction.

Ordinarily, servo-type acceleration sensors, servo-type velocity sensors or geophone sensors, etc., are used as the horizontal vibration sensors 1a, 1b, 1c and vertical vibration sensors 2a, 2b, 2c. In this embodiment, however, servo-type vibration sensors will be described throughout as the sensors used, in order to simplify the description. The vertical displacement sensors 3a, 3b, 3c have their axes of displacement detection aligned with the vertical direction and sense displacement of the vibration isolation platform 6 along the vertical direction.

If the degrees of freedom of motion of the vibration isolation platform 6 are expressed based upon the XYZ coordinate system, there will be a total of six motion modes, namely, three translational modes regarding respective ones of the X, Y and Z axes and three rotational modes regarding rotation θx, θy and θz about respective ones of these axes. Vibrational feedback of the vibration isolator also is applied in each of these motion modes. In the three translation modes regarding the X, Y and Z axes, it is necessary to correct for inclination, because the sensor output signals of this motion feedback include inclination components ascribable to inclination of the vibration isolation platform 6. In the three rotational modes regarding θx, θy and θz, no correction for inclination is required. The reason for this is that since the rotational modes are calculated using the difference signal between the outputs of two vibration sensors that bracket the center of gravity of the vibration isolation platform 6, the inclination components in the output signals of the vibration sensors also are cancelled out by calculating the difference signal.

Figure 5:
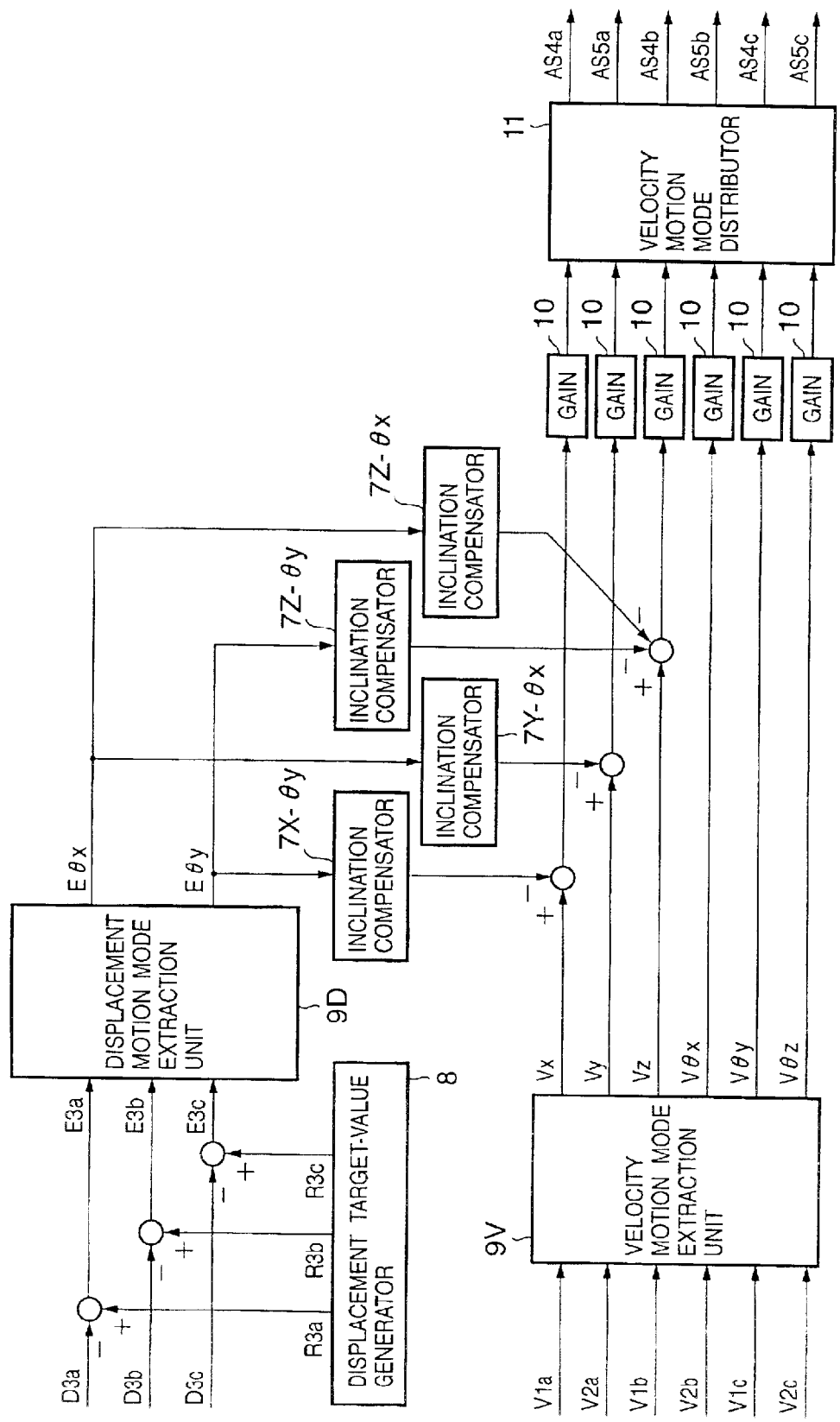
FIG. 5 is a block diagram illustrating the control system of the vibration isolator shown in FIG. 4.
Figure 6A:
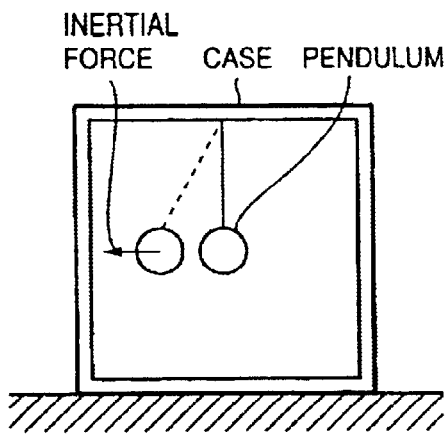
FIGS. 6A and 6B are diagrams showing the operating principle of a servo-type vibration sensor.
Figure 6B:
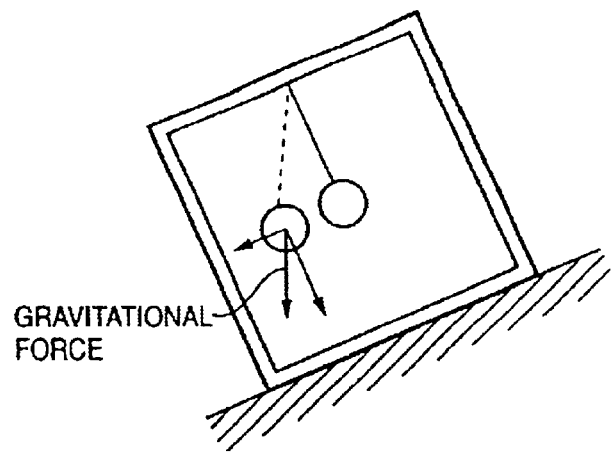

FIG. 5 is a block diagram of a control system adapted for correction of inclination. Vibration feedback is applied to the air springs after the velocity signals are subjected to an appropriate gain. The effect of a sky-hook spring is thus applied to the vibration isolation platform 6. The servo-type vibration sensors sense absolute velocity in space and the air springs generate internal pressure by integration with respect to the drive signals. The sky-hook spring is thus implemented by the arrangement of FIG. 5.

Since vibration feedback is applied in each motion mode, an extraction unit 9V for extracting the velocity motion modes and a distributor 11 for distributing the velocity motion modes are provided. Let V1a, V1b and V1c represent the horizontal velocity signals of the vibration isolation platform 6 sensed by the horizontal vibration sensors 1a, 1b and 1c, respectively, and let V2a, V2b and V2c represent the vertical velocity signals of the vibration isolation platform 6 sensed by the vertical vibration sensors 2a, 2b and 2c, respectively.

These signals are input to the extraction unit 9V for extracting the velocity motion modes, which proceeds to calculate X-mode velocity, Y-mode velocity, Z-mode velocity, θx-mode angular velocity, θy-mode angular velocity and θz-mode angular velocity, and to output these velocity signals Vx, Vy, Vz, Vθx, Vθy and Vθz.

These velocity signals are subjected to appropriate gain 10 in each motion mode, after which drive signals for respective ones of the air springs are generated by the distributor 11 for distributing the velocity motion modes. The drive signals for the horizontal air springs 4a, 4b, 4c are represented by AS4a, AS4b, AS4c, respectively, and the drive signals for the vertical air springs 5a, 5b, 5c are represented by AS5a, AS5b, AS5c, respectively.

Though not illustrated, internal pressure conforming to these drive signals is generated in respective ones of the air springs via power amplifiers and air valves in exactly the same manner as shown in the case of FIG. 2. As a result of the foregoing, the effect of a sky-hook spring can be applied to the vibration isolation platform 6. Under these conditions, however, the velocity signals Vx, Vy and Vx will each contain an inclination component ascribable to inclination of the vibration isolation platform 6. As a consequence, instead of having its vibration suppressed, the vibration isolation platform 6 is caused to shake or oscillate by such vibration feedback.

Inclination of the vibration isolation platform 6 is its angle of rotation about the X axis or Y axis. The vertical displacement sensors 3a, 3b, 3c construct angle sensors. If the differences between the output signals of these sensors are calculated with regard to the X and Y directions and the displacements in the θx and θy modes are calculated, the results will represent the inclination of the vibration isolation platform 6.

By utilizing the θx- and θy-mode displacements, an inclination correction can be carried out in excellent fashion even in a case where the vibration isolation platform 6 has six degrees of freedom of motion. Inclination about the Y axis, namely, the θy-mode displacement, is used when considering an inclination correction in the direction of X-axis translation, and inclination about the X axis, namely the θx-mode displacement, is used when considering an inclination correction in the direction of Y-axis translation. Correction of inclination along the direction of the Z axis requires that inclination about both the X and Y axes be taken into account. Two inclination corrections are, therefore, necessary, namely, an inclination correction using the θx-mode displacement and an inclination correction using the θy-mode displacement.

In FIG. 5, output signals D3a, D3b and D3c from the vertical displacement sensors 3a, 3b, 3c are subtracted from neutral-state displacement signals R3a, R3b and R3c, respectively, generated by a displacement target-value generator 8, whereby reference displacement signals E3a, E3b and E3c are generated.

The reference displacement signals E3a, E3b and E3c are subsequently converted to a θx-mode displacement signal Eθx and a θy-mode displacement signal Eθy, which are displacement signals about the X and Y axes, respectively. An extraction unit 9D for extraction of displacement-motion mode performs a calculation for generating the displacement signal Eθx about the X axis and the displacement signal Eθy about the Y axis.

The inclination component contained in the X-mode velocity signal Vx is ascribable to inclination about the Y axis. Accordingly, if an appropriate inclination compensator 7X-θ acts upon the θy-mode displacement signal Eθy to provide an inclination correction signal in the direction of X-axis translation and then this correction signal is subtracted from the X-mode velocity signal Vx, the inclination component can be cancelled from the X-mode velocity signal Vx. This inclination correction makes it possible to implement an ideal sky-hook spring in the X mode.

Further, the inclination component contained in the Y-mode velocity signal Vy is ascribable to inclination about the X axis. Accordingly, if an appropriate inclination compensator 7Y-θ acts upon the θx-mode displacement signal Eθx to provide an inclination correction signal in the direction of Y-axis translation and then this correction signal is subtracted from the Y-mode velocity signal Vy, the inclination component can be cancelled from the Y-mode velocity signal Vy. This inclination correction makes it possible to implement an ideal sky-hook spring in the Y mode.

The inclination component contained in the Z-mode velocity signal Vz is ascribable to both inclination about the X axis and inclination about the Y axis. Accordingly, if a compensation value (inclination correction value) obtained by causing an appropriate inclination compensator 7Z-θy to act upon the θy-mode displacement signal Eθy and a compensation value (inclination correction value) obtained by causing an appropriate inclination compensator 7Z-θx to act upon the θx-mode displacement signal Eθx are each subtracted from the X-mode velocity signal Vx, then the inclination component can be cancelled from the Z-mode velocity signal Vz. This inclination correction makes it possible to implement an ideal sky-hook spring in the Z mode.

Figure 4:
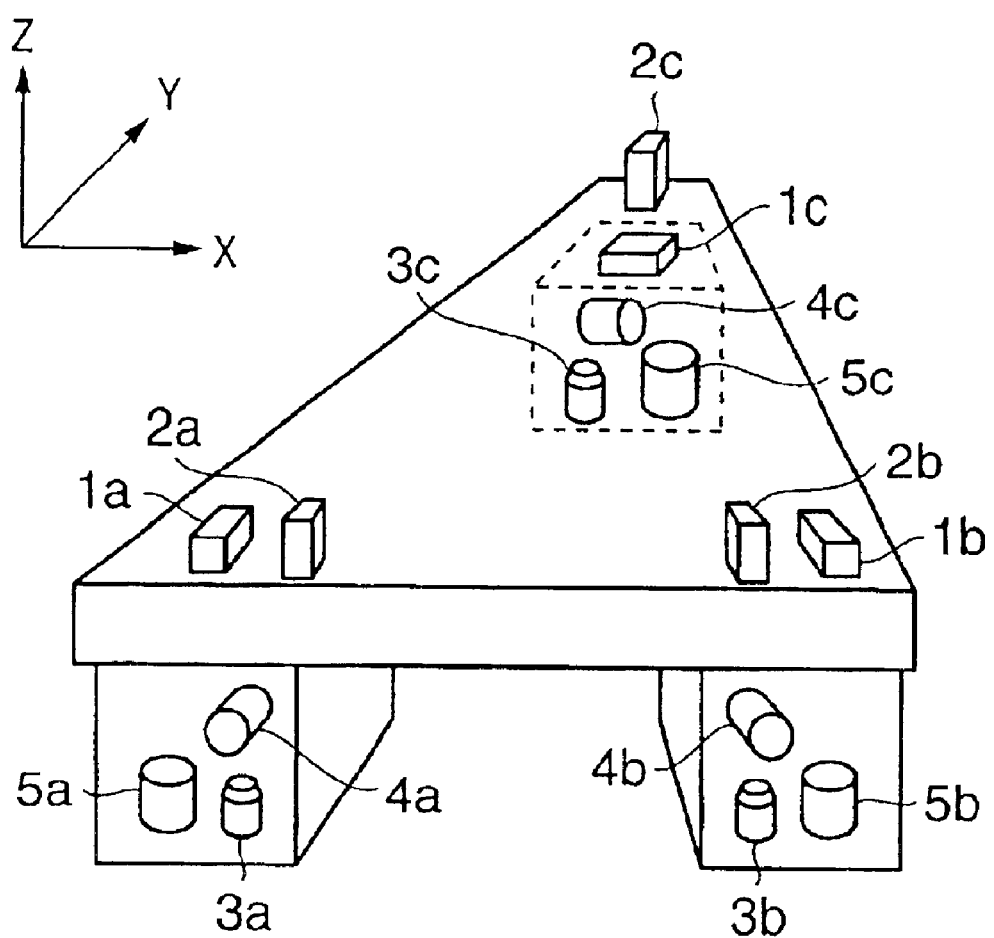
FIG. 4 is a diagram showing an example of the mechanical structure of the vibration isolator according to the present invention.

An embodiment in which the invention is applied to the triangle-shaped vibration isolation platform 6 is disclosed in FIGS. 4 and 5. However, the scope of application of the present invention is not limited to this case. The essence of the present invention, namely that the inclination of a vibration isolation platform is sensed even by displacement sensors to thereby correct for inclination of a vibration sensor, can be realized irrespective of the number of air-spring legs serving as support legs and irrespective of whether the exposure system used in a semiconductor manufacturing apparatus is a step-and-repeat system or step-and-scan system.

Embodiment of a Semiconductor Production System

Described next will be an example of a system for producing semiconductor devices (e.g., semiconductor chips such as IC and LSI chips, liquid crystal panels, CCDs, thin-film magnetic heads and micromachines, etc.). This system utilizes a computer network outside the semiconductor manufacturing plant to provide troubleshooting and regular maintenance of manufacturing equipment installed at the manufacturing plant and to furnish maintenance service such as the provision of software.

Figure 8:
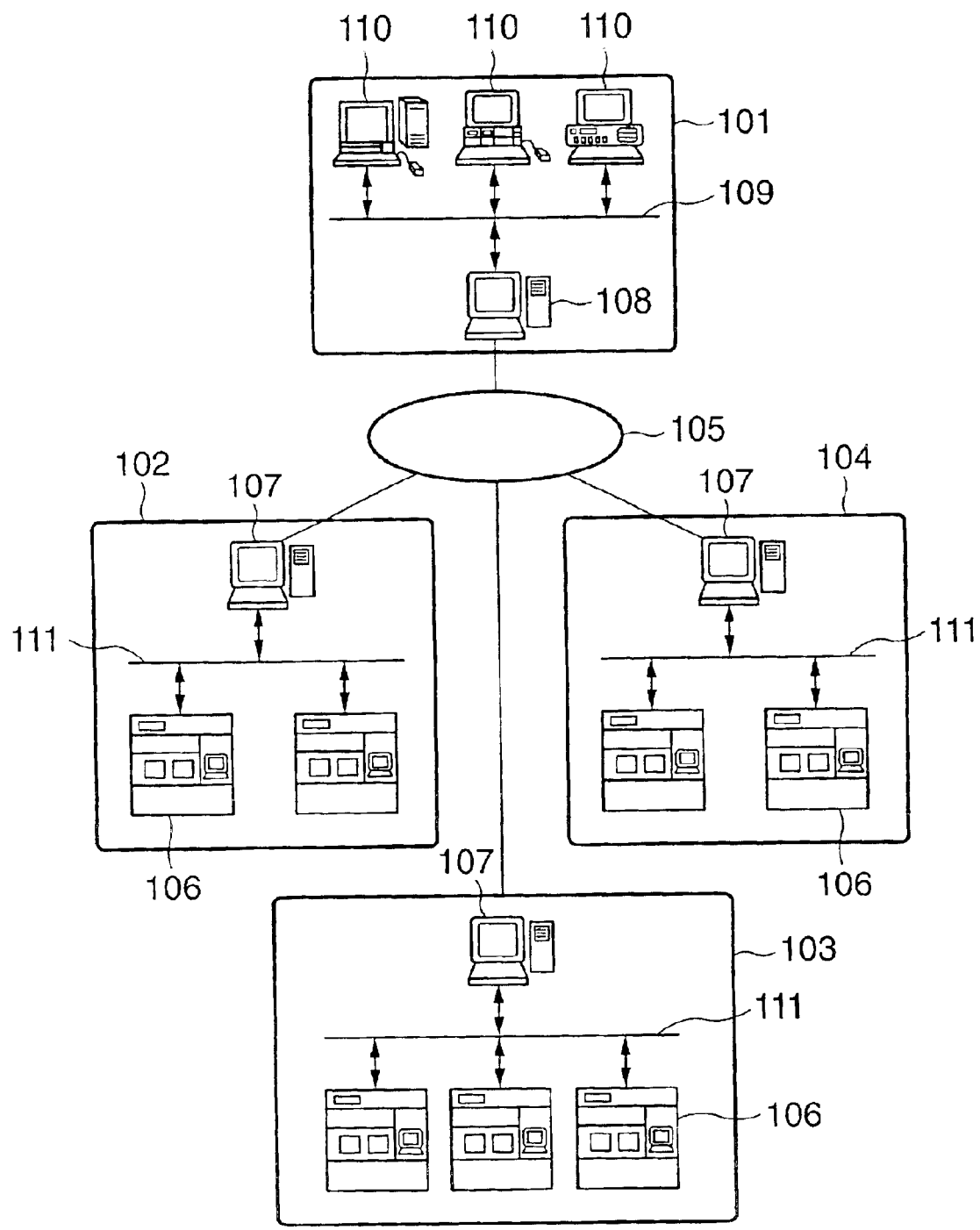
FIG. 8 is a conceptual view showing a semiconductor device production system as seen from a certain angle.

FIG. 8 illustrates the overall system as seen from a certain angle.

The system includes a business office 101 of the vendor (equipment supplier) that provides the apparatus for manufacturing semiconductor devices. Semiconductor manufacturing apparatus for performing various processes used in a semiconductor manufacturing plant is assumed to be the manufacturing apparatus. Examples of the apparatus are pre-treatment apparatus (e.g., lithographic apparatus such as exposure apparatus, resist treatment apparatus and etching apparatus, heat treatment apparatus, thin-film apparatus and smoothing apparatus, etc.) and post-treatment apparatus (e.g., assembly apparatus and inspection apparatus, etc.).

The business office 101 includes a host management system 108 for providing a manufacturing-apparatus maintenance database, a plurality of control terminal computers 110, and a local-area network (LAN) 109 for connecting these components into an intranet. The host management system 108 has a gateway for connecting the LAN 109 to the Internet 105, which is a network external to the business office 101, and a security function for limiting access from the outside.

Numerals 102 to 104 denote manufacturing plants of semiconductor makers which are the users of the manufacturing apparatus. The manufacturing plants 102 to 104 may be plants belonging to makers that differ from one another or plants belonging to the same maker (e.g., pre-treatment plants and post-treatment plants, etc.). Each of the plants 102 to 104 is provided with a plurality of manufacturing apparatus 106, a local-area network (LAN) 111 which connects these apparatus to construct an intranet, and a host management system 107 serving as a monitoring unit for monitoring the status of operation of each manufacturing apparatus 106.

The host management system 107 provided at each of the plants 102 to 104 has a gateway for connecting the LAN 111 in each plant to the Internet 105 serving as the external network of the plants. As a result, it is possible for the LAN of each plant to access the host management system 108 on the side of the vendor 101 via the Internet 105. By virtue of the security function of the host management system 108, users allowed to access the host management system 108 are limited.

More specifically, status information (e.g., the condition of manufacturing apparatus that has malfunctioned), which indicates the status of operation of each manufacturing apparatus 106, can be reported from the plant side to the vendor side. In addition, information in response to such notification (e.g., information specifying how to troubleshoot the problem, troubleshooting software and data, etc.), as well as the latest software and maintenance information such as help information, can be acquired from the vendor side.

A communication protocol (TCP/IP), which is used generally over the Internet, is employed for data communication between the plants 102~104 and the vendor 101 and for data communication over the LAN 111 within each plant. Instead of utilizing the Internet as the external network of a plant, it is also possible to utilize a highly secure leased-line network (ISDN, etc.) that cannot be accessed by a third party. Further, the host management system is not limited to that provided by a vendor, for an arrangement may be adopted in which the user constructs a database, places it on an external network and allows the database to be accessed from a number of plants that belong to the user.

Figure 9:
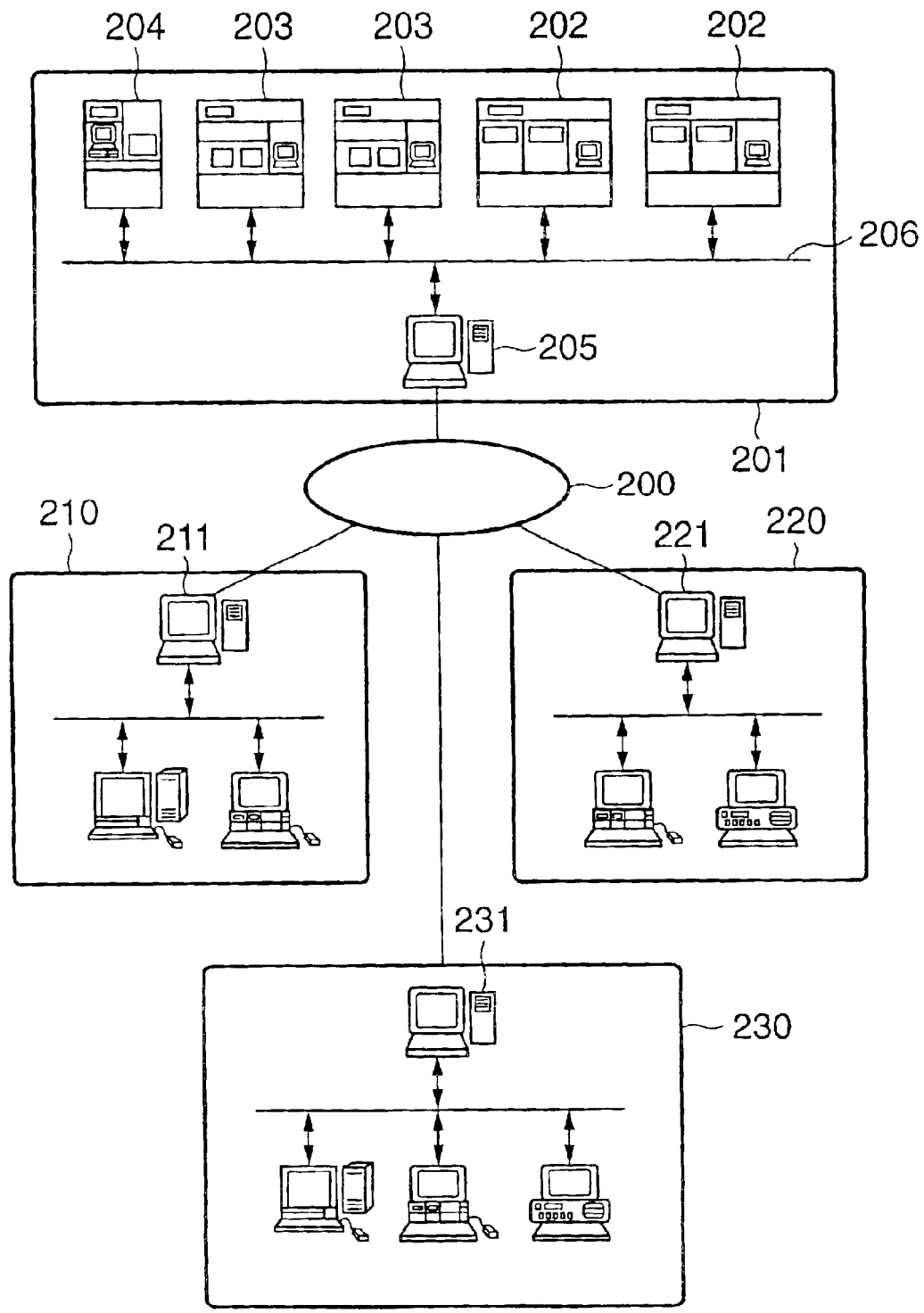
FIG. 9 is a conceptual view showing the semiconductor device production system as seen from another angle.
Figure 11:
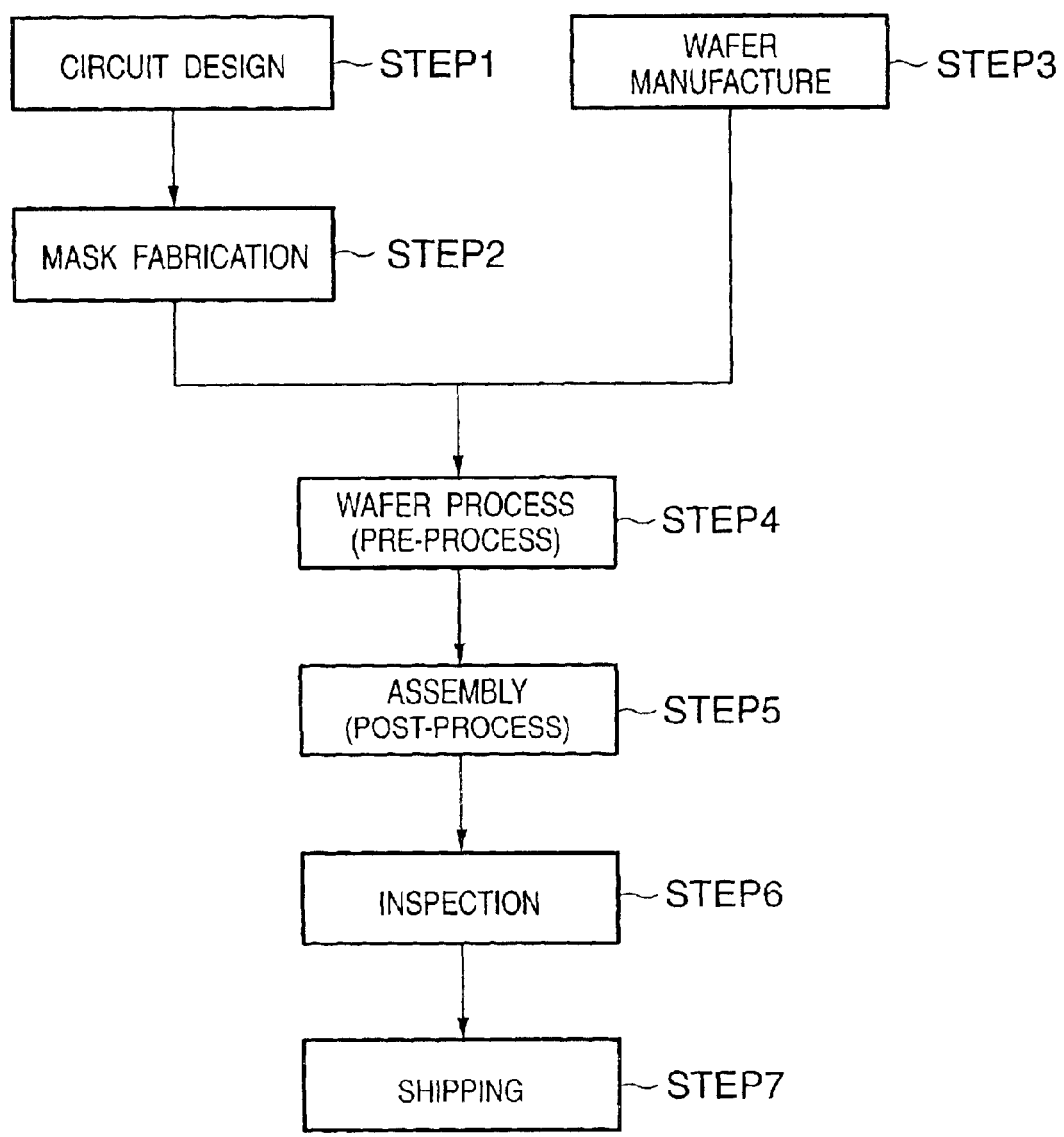
FIG. 11 is a diagram useful in describing the flow of a device manufacturing process.

FIG. 9 is a conceptual view illustrating the overall system of this embodiment as seen from an angle different from that depicted in FIG. 8.

In the earlier example, a plurality of user plants each having manufacturing apparatuses are connected by an external network to the management system of the vendor that provided the manufacturing apparatus, and information concerning the production management of each plant and information concerning at least one manufacturing apparatus is communicated by data communication via the external network.

In the example of FIG. 9, on the other hand, a plant having a plurality of manufacturing apparatus provided by a plurality of vendors is connected by an outside network to management systems of respective ones of the vendors of these plurality of manufacturing apparatus, and maintenance information for each manufacturing apparatus is communicated by data communication. As shown in the drawing, the system includes a manufacturing plant 201 of the user of the manufacturing apparatus (the maker of semiconductor devices). The manufacturing line of this plant includes manufacturing apparatus for implementing a variety of processes. Examples of such apparatus are exposure apparatus 202, resist treatment apparatus 203 and thin-film treatment apparatus 204.

Though only one manufacturing plant 201 is shown in FIG. 9, in actuality a plurality of these plants are networked in the same manner. The apparatus in the plant are interconnected by a LAN 206 to construct an intranet and the operation of the manufacturing line is managed by a host management system 205. The business offices of vendors (equipment suppliers) such as an exposure apparatus maker 210, a resist treatment apparatus maker 220 and a thin-film apparatus equipment maker 230 have host management systems 211, 221, 231, respectively, for remote maintenance of the apparatus they have supplied. These have maintenance databases and gateways to the outside network, as described earlier. The host management system 205 for managing each apparatus in the manufacturing plant of the user is connected to the management systems 211, 221, 231 of the vendors of these apparatus by the Internet or leased-line network serving as an external network 200.

If any of the series of equipment in the manufacturing line malfunctions, the line ceases operating. However, this can be dealt with rapidly by receiving remote maintenance from the vendor of the faulty equipment via the Internet 200, thereby making it possible to minimize line downtime.

Each manufacturing apparatus installed in the semiconductor manufacturing plant has a display, a network interface and a computer for executing network-access software and equipment operating software stored in a storage device. The storage device can be an internal memory or hard disk or a network file server. The software for network access includes a special-purpose or general-purpose Web browser and presents a user interface, which has a screen of the kind shown by way of example in FIG. 10, on the display.

The operator managing the manufacturing equipment at each plant enters information at the input items on the screen while observing the screen. The information includes model 401 of the manufacturing apparatus, its serial number 402, subject matter 403 of the problem, its date of occurrence 404, degree of urgency 405, the particular condition 406, countermeasure method 407 and progress report 408. The entered information is transmitted to the maintenance database via the Internet. The resulting appropriate maintenance information is sent back from the maintenance database and is presented on the display screen.

The user interface provided by the Web browser implements hyperlink functions 410, 411, 412 as illustrated and enables the operator to access more detailed information for each item, to extract the latest version of software, which is used for the manufacturing equipment, from a software library provided by the vendor, and to acquire an operating guide (help information) for reference by the plant operator.

The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation).

The semiconductor device fabricated at step 5 is subjected to inspections such as an operation verification test and a durability test at step 6 (inspection). The semiconductor device is completed through these steps and then is shipped (step 7). The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or leased-line network.

Figure 12:
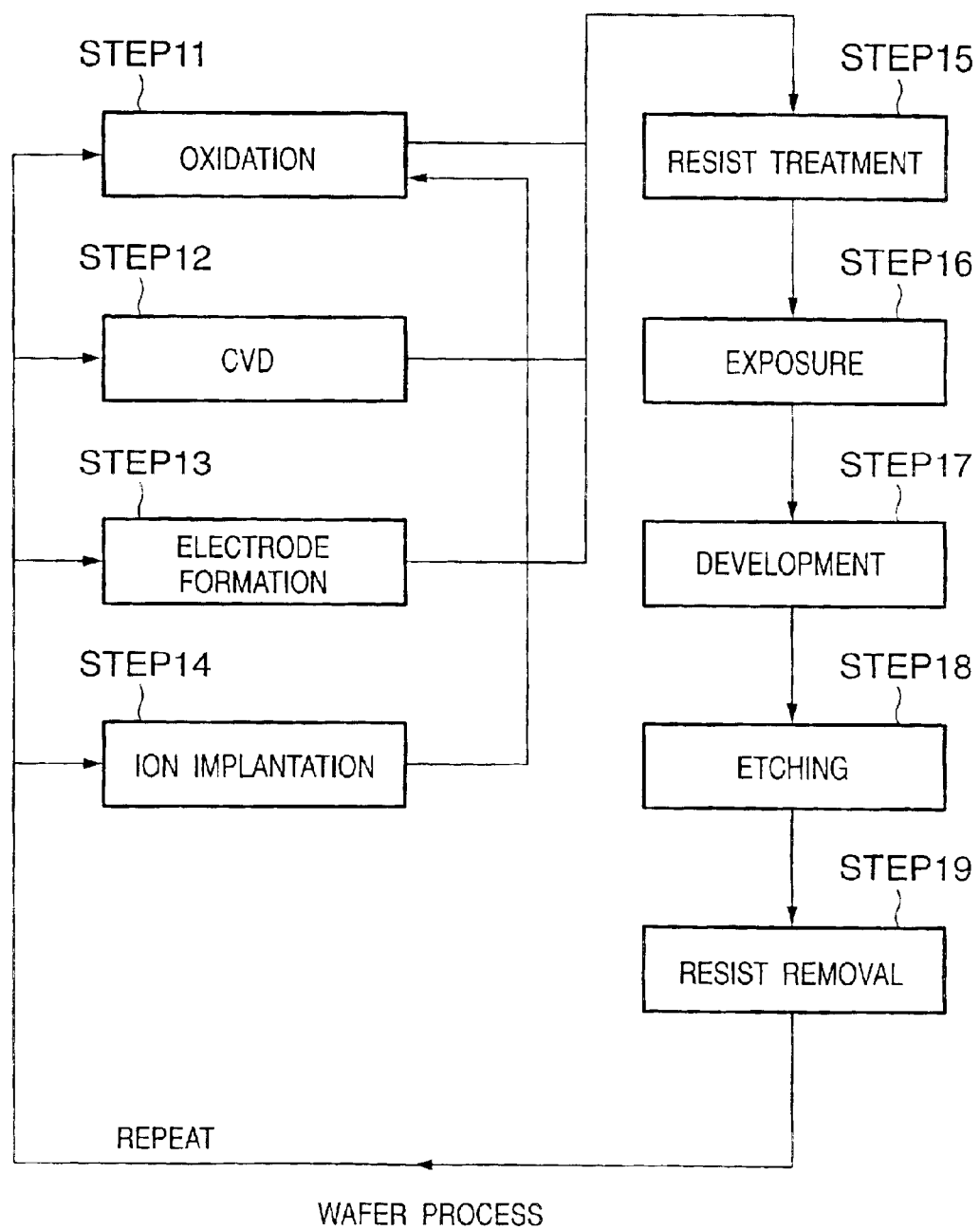
FIG. 12 is a diagram useful in describing a wafer process.

FIG. 12 is a flowchart illustrating the detailed flow of the wafer process mentioned above.

The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly.

The manufacturing apparatus used at each of these steps has its main body mounted on the above-described vibration isolation platform. This makes it possible to manufacture a precision semiconductor device. Further, since each manufacturing apparatus is maintained by the remote maintenance system described above, malfunctions can be prevented and quick recovery is possible if a malfunction should happen to occur. As a result, the productivity of semiconductor device manufacture can be improved over the prior art.

Thus, in accordance with the present invention as described above, the angle of inclination of a vibration isolation platform is sensed by an angle sensor and the output signal of a vibration sensor is corrected based upon the output of the angle sensor. As a result, vibration in the particular direction can be sensed. Since use is made of a vibration sensor signal that has been corrected for inclination, it is possible to provide a vibration isolator that is capable of controlling vibration of the vibration isolation platform in excellent fashion by applying the appropriate, ideal vibration feedback.

Further, in accordance with the present invention, it is possible to provide a highly precise device manufacturing apparatus and method, a semiconductor manufacturing plant and a method of maintaining the device manufacturing apparatus that employ the above-described vibration isolator.

The present invention is not limited to the above embodiments and various changes and modifications can be made within the sprit and scope of the present invention. Therefore, to apprise the public of the scope of the present invention the following claims are made.

What is claimed is:

1. A vibration isolator comprising:
a vibration isolation platform;
a vibration sensor installed on said vibration isolation platform; and
an angle sensor for sensing an inclination angle of said vibration isolation platform,
wherein a detection signal from said vibration sensor is corrected based upon an output from said angle sensor, and the corrected detection signal is used in order to suppress vibration of said vibration isolation platform.

2. A vibration isolator according to claim 1, wherein said angle sensor includes two or more displacement sensors for sensing vertical displacement of said vibration isolation platform at two or more locations,
each displacement sensor sensing vertical displacement of said vibration isolation platform at its particular position, and
the angle of inclination of said vibration isolation platform being calculated from the difference between detection signals produced by said displacement sensors.

3. A vibration isolator according to claim 1, further comprising an inclination compensator for converting an inclination signal output by said angle sensor to an inclination correction signal that is equivalent to an inclination component of the detection signal from said vibration sensor,
wherein the inclination component is cancelled out by the inclination correction signal.

4. A vibration isolator according to claim 1, wherein said vibration sensor is a velocity sensor or an acceleration sensor.

5. A vibration isolator according to claim 1, wherein said vibration sensor is a servo-type velocity sensor or a servo-type acceleration sensor.

6. A vibration isolator according to claim 1, wherein said vibration isolation platform is supported along vertical and horizontal axes by actuators, and the detection signal from said vibration sensor is fed back to drive said actuators, thereby suppressing translational vibration of said vibration isolation platform along the vertical and horizontal axes, and rotational vibration of said vibration isolation platform about the vertical and horizontal axes.

7. A vibration isolator according to claim 1, wherein correction of the detection signal from said vibration sensor is carried out with respect to a transitional vibration signal fed back, based upon the detection signal from said vibration sensor, to drive said vibration isolation platform.

8. A semiconductor device manufacturing apparatus comprising a vibration isolator and a main body of said apparatus, said vibration isolator comprising:
a vibration isolation platform;
a vibration sensor installed on said vibration isolation platform; and
an angle sensor for sensing an inclination angle of said vibration isolation platform,
wherein a detection signal from said vibration sensor is corrected based upon an output from said angle sensor, the corrected detection signal is used in order to suppress vibration of said vibration isolation platform, and said main body of said apparatus is installed on said vibration isolator.

9. An apparatus according to claim 8, wherein said semiconductor device manufacturing apparatus is at least one of an exposure apparatus, a resist treatment apparatus, an etching apparatus, a heat treatment apparatus, a thin-film forming apparatus, a smoothing apparatus, an assembly apparatus and an inspection apparatus.

10. An apparatus according to claim 8, further comprising:
a display;
a network interface; and
a computer for running network software,
wherein maintenance information related to said manufacturing apparatus is communicated by data communication via a computer network.

11. An apparatus according to claim 10, wherein the network software provides said display with a user interface for accessing a maintenance database, which is connected to an external network outside of a plant at which said apparatus has been installed, and which is supplied by a vendor or user of said apparatus, thereby making it possible to obtain information from the database via the external network.

12. A method of manufacturing a semiconductor device, said method comprising steps of:
placing a group of manufacturing apparatuses for performing various processes, inclusive of a semiconductor device manufacturing apparatus comprising a vibration isolator and a main body of the apparatus, in a plant for manufacturing semiconductor devices; and
manufacturing a semiconductor device by performing a plurality of processes using the group of manufacturing apparatuses,
wherein the vibration isolator comprises:
a vibration isolation platform;
a vibration sensor installed on the vibration isolation platform; and
an angle sensor for sensing an inclination angle of the vibration isolation platform,
wherein a detection signal from the vibration sensor is corrected based upon an output from the angle sensor, the corrected detection signal is used in order to suppress vibration of the vibration isolation platform, and the main body of the semiconductor device manufacturing apparatus is installed on the vibration isolator.

13. A method according to claim 12, further comprising:
interconnecting the group of manufacturing apparatuses by a local-area network; and
communicating, by data communication, information relating to at least one manufacturing apparatus in the group between the local-area network and an external network outside the plant.

14. A method according to claim 13, further comprising performing one of (i) obtaining maintenance information for the manufacturing apparatus by accessing, by data communication via the external network, a database provided by a vendor or user of the manufacturing apparatus, and (ii) production management by data communication with a semiconductor manufacturing plant different from the first-mentioned semiconductor manufacturing plant via the external network.

15. A semiconductor manufacturing plant, comprising:

a group of manufacturing apparatuses for performing various processes, inclusive of a semiconductor device manufacturing apparatus comprising a vibration isolator and a main body of said apparatus;

a local-area network for interconnecting said group of manufacturing apparatuses; and a gateway for making it possible to access, from said local-area network, an external network outside said plant, wherein said vibration isolator includes:

a vibration isolation platform;

a vibration sensor installed on said vibration isolation platform; and an angle sensor for sensing an inclination angle of said vibration isolation platform, wherein a detection signal from said vibration sensor is corrected based upon an output from said angle sensor, the corrected detection signal is used in order to suppress vibration of said vibration isolation platform, and said main body of said apparatus is installed on said vibration isolator, and information relating to at least one manufacturing apparatus in said group is communicated by data communication.

16. A method of maintaining a semiconductor device manufacturing apparatus installed in a semiconductor manufacturing plant, said method comprising steps of:

providing a maintenance database, which is connected to an external network outside the semiconductor manufacturing plant, by a vendor or user of the manufacturing apparatus;

allowing access to the maintenance database from within the semiconductor manufacturing plant via the external network;

transmitting maintenance information, which is stored in the maintenance database, to the semiconductor manufacturing plant via the external network;

providing a vibration isolator which comprises:

(i) a vibration isolation platform, (ii) a vibration sensor installed on the vibration isolation platform, and (iii) an angle sensor for sensing an inclination angle of the vibration isolation platform; and correcting a detection signal from the vibration sensor based upon an output from the angle sensor, the corrected detection signal being used in order to suppress vibration of the vibration isolation platform, with a main body of the apparatus being installed on the vibration isolator.

* * * * *

UNITED STATES PATENT AND TRADEMARK OFFICE
CERTIFICATE OF CORRECTION

PATENT NO.        : 6,825,635 B2                                          Page 1 of 1
APPLICATION NO. : 10/102726
DATED             : November 30, 2004
INVENTOR(S)       : Hiroaki Kato It is certified that error appears in the above-identified patent and that said Letters Patent is hereby corrected as shown below:

ON THE COVER PAGE:
   In item "(*) Notice:" the last line, "U.S.C. 154(b) by 268 days." should read -- U.S.C. 154(b) by 358 days. --.

COLUMN 4:
   Line 46, "inclusive of" should read -- including --.

COLUMN 5:
   Line 1, "inclusive of" should read -- including --.

COLUMN 6:
   Line 12, "damp" should read -- dampen --.
   Line 53, "in dependence" should read -- depending --.

COLUMN 10:
   Line 36, the second occurrence of "Vx" should read -- Vz --.

COLUMN 17:
   Line 27, before "information" insert -- wherein --.

Signed and Sealed this

Fourteenth Day of August, 2007

JON W. DUDAS
*Director of the United States Patent and Trademark Office*